US011650227B2

(12) United States Patent
Feng et al.

(10) Patent No.: US 11,650,227 B2
(45) Date of Patent: May 16, 2023

(54) SYSTEM AND METHOD FOR ATTENUATING AND/OR TERMINATING RF CIRCUIT

(71) Applicant: XCERRA CORPORATION, Norwood, MA (US)

(72) Inventors: Yukang Feng, Santa Clara, CA (US); Nadia Steckler, St. Paul, MN (US); Jason Mroczkowski, St. Paul, MN (US); James Hattis, St. Paul, MN (US)

(73) Assignee: XCERRA CORPORATION, Norwood, MA (US)

( * ) Notice: Subject to any disclaimer, the term of this patent is extended or adjusted under 35 U.S.C. 154(b) by 0 days.

(21) Appl. No.: 17/142,987

(22) Filed: Jan. 6, 2021

(65) Prior Publication Data

US 2021/0223285 A1 Jul. 22, 2021

Related U.S. Application Data

(60) Provisional application No. 62/957,695, filed on Jan. 6, 2020.

(51) Int. Cl.
*G01R 1/04* (2006.01)
*H01R 13/646* (2011.01)
*H01P 3/08* (2006.01)

(52) U.S. Cl.
CPC .............. *G01R 1/045* (2013.01); *H01P 3/08* (2013.01); *H01R 13/646* (2013.01); *H01R 2201/20* (2013.01)

(58) Field of Classification Search
CPC .......... G01R 1/045; H01P 3/08; H01R 13/646; H01R 2201/20
See application file for complete search history.

(56) References Cited

U.S. PATENT DOCUMENTS

| 4,697,143 | A | * | 9/1987 | Lockwood | G01R 1/06772 324/762.05 |
| 5,172,051 | A | * | 12/1992 | Zamborelli | G01R 1/06772 324/149 |
| 2015/0048980 | A1 | * | 2/2015 | Chin | G01R 1/045 343/703 |
| 2015/0111496 | A1 | * | 4/2015 | McCormack | H04B 5/0031 455/41.1 |
| 2015/0369840 | A1 | * | 12/2015 | Treibergs | H05K 7/10 324/755.05 |

FOREIGN PATENT DOCUMENTS

| CN | 100365093 | C | * | 1/2008 | |
| JP | H1262479 | A | * | 10/1989 | |
| JP | 06181123 | A | * | 6/1994 | |
| WO | WO-0033414 | A2 | * | 6/2000 | ............... H01Q 1/42 |

OTHER PUBLICATIONS

English Translation of JPH01262479A (Year: 1989).*
English Translation of JPH06181123A (Year: 1994).*

* cited by examiner

*Primary Examiner* — Paresh Patel
(74) *Attorney, Agent, or Firm* — Viksnins Harris Padys Malen LLP

(57) ABSTRACT

A high-speed circuit assembly includes a high-speed circuit including at least one waveguide/transmission line, and a radiation absorbing material disposed in contact with or in close proximity with the waveguide/transmission line.

3 Claims, 10 Drawing Sheets

SYSTEM AND METHOD FOR ATTENUATING AND/OR TERMINATING RF CIRCUIT

CROSS-REFERENCE TO RELATED APPLICATION

This application claims priority to U.S. Provisional Application No. 62/957,695 that was filed on Jan. 6, 2020. The entire content of the applications referenced above is hereby incorporated by reference herein.

TECHNICAL FIELD

High frequency circuit assemblies and related methods.

TECHNICAL BACKGROUND

Test contactors are used on printed circuit boards to test various parameters and components of semiconductor devices. As electronic devices have become smaller and more powerful, circuit boards on which the electronic devices are mounted have become more crowded and complex. For example, modern automobiles use RADAR equipment for collision avoidance, parking assist, automated driving, and cruise control. The radio frequencies used in such systems are typically 76-81 GHz (W-band). Radio frequencies used for Wi-Fi applications are in the range of 56-64 GHz. The upcoming 5G cellular and cellular backhaul market uses frequencies in the sub 6 GHz, the 24-30 GHz, 37-48 GHz, and 64-71 GHz bands. Furthermore, to minimize the footprint of the wireless chipset, semiconductor device include antenna in package designs. Some circuits that operate at these frequencies require signal attenuation components and RF choke circuits to extract a DC signal component from a high frequency RF signal. At high frequency, the attenuation devices are typically formed from a thin film process and are also typically surface mount devices. However, standard surface mount components tend to have parasitic impedance at higher frequencies. In addition, there are limits on where thin film components are used. Finally, thin film processes are expensive and difficult to implement in certain devices, such as a test contactor assembly.

At high frequency, the RF Choke devices are typically surface mount devices formed using a thin film process. However, these devices have several disadvantages. First, they tend to have parasitic impedance at higher frequencies. Second, thin film components cannot be used in all environments. Third, thin film processes are expensive and difficult to implement in certain devices, such as a test contactor assembly.

For these and other reasons there is a need for alternative structures and methods to attenuate RF signals and to extract DC components from an RF signal in high frequency circuits.

SUMMARY

Consistent with the disclosed embodiments, a circuit assembly is disclosed. The circuit assembly comprises a circuit including a waveguide/transmission line including a waveguide/transmission line end, the waveguide/transmission line to carry a radio frequency signal. The circuit assembly further comprises a radiation absorbing material in contact with or in close proximity with the waveguide/transmission line, the radiation absorbing material to modify the radio frequency signal.

Consistent with some other embodiments, a method is disclosed. The method comprises applying a signal to a circuit assembly including a circuit including a waveguide/transmission line and radiation absorbing material, the radiation absorbing material in contact with or in close proximity with the waveguide/transmission line, the waveguide/transmission line extending to a waveguide/transmission line end. The method further comprises attenuating or radio frequency choking the high frequency signal with the radiation absorbing material.

Consistent with some other embodiments, a test socket is disclosed. The test socket comprises a frame assembly having a socket opening sized and configured to receive a device under test therein. The test socket further comprises a high-speed circuit including a waveguide/transmission line extending to a waveguide/transmission line end, the high-speed circuit including a lead frame assembly disposed adjacent to the frame assembly, the waveguide/transmission line to carry a radio frequency signal including a high frequency signal and a substantially direct current signal. The test socket further comprises a radiation absorbing material in contact with or in close proximity with the waveguide/transmission line, the radiation absorbing material to attenuate or block the high frequency signal and allow the substantially direct current signal to pass in the waveguide/transmission line.

DESCRIPTION

The following detailed description includes references to the accompanying drawings, which form a part of the detailed description. The drawings show, by way of illustration, specific embodiments in which the apparatus may be practiced. These embodiments, which are also referred to herein as "examples" or "options," are described in enough detail to enable those skilled in the art to practice the present embodiments. The embodiments may be combined, other embodiments may be utilized, or structural or logical changes may be made without departing from the scope of the invention. The following detailed description is, therefore, not to be taken in a limiting sense and the scope of the invention is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

A device is described herein including the implementation of radiation absorbing material for use as an electronic attenuator and an RF Choke which aids in extracting a DC component of a signal in high frequency circuits. In one or more embodiments, the device includes a test socket assembly 100, shown in FIG. 1.

Figure 1:
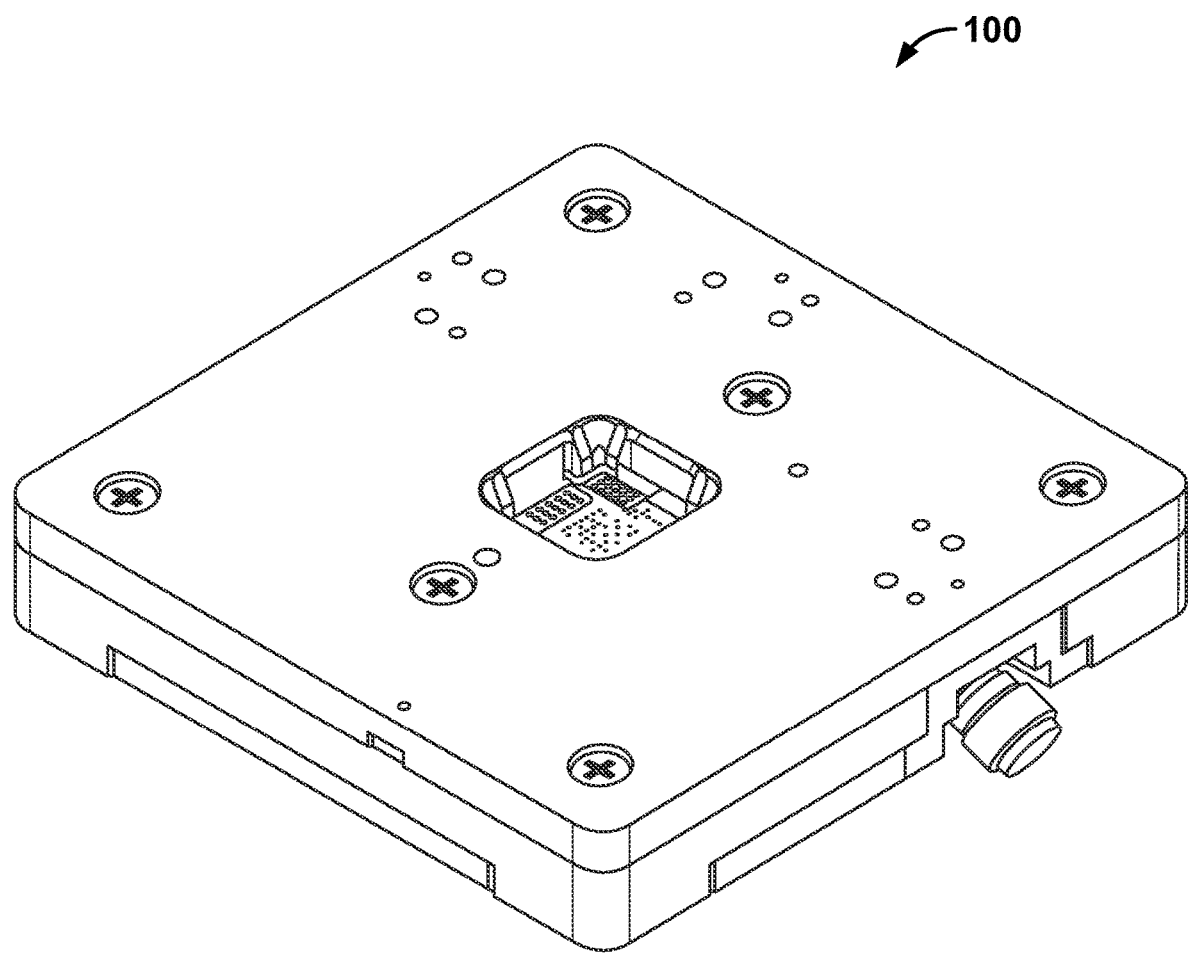
FIG. 1 illustrates a perspective view of a test contactor assembly as constructed in one or more embodiments.
Figure 2:
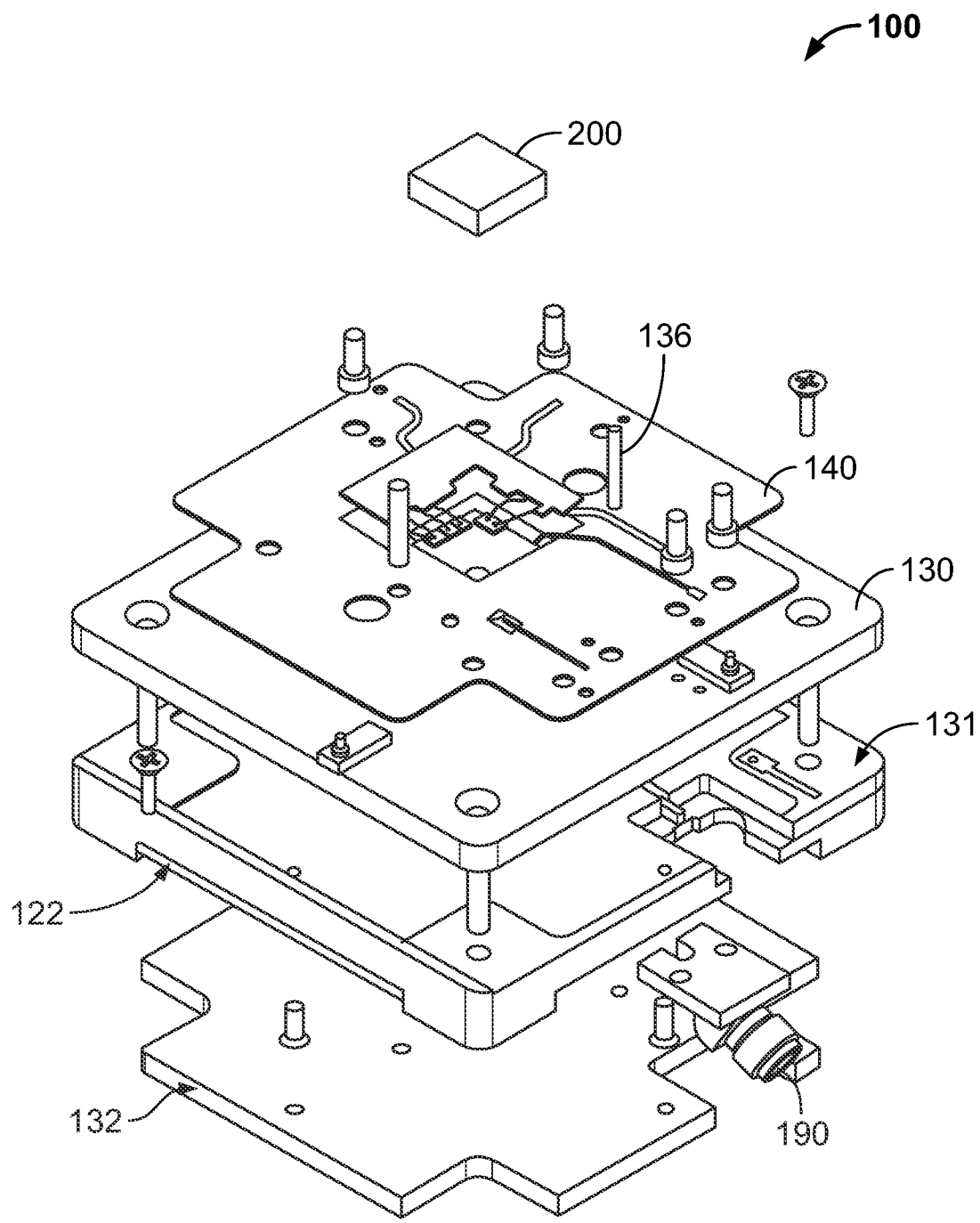
FIG. 2 illustrates a perspective view of a test contactor assembly as constructed in one or more embodiments.

FIG. 1 and FIG. 2 illustrate a test socket assembly 100, such as an mmWave contactor, including a high frequency circuit assembly. In one or more embodiments, the high frequency circuit assembly operates at functioning frequencies in the range of between about 37 GHz and about 81 GHz. In one or more embodiments, the high frequency circuit assembly operates at functioning frequencies of between about 20 GHz and about 40 GHz. In one or more embodiments, the high frequency circuit assembly operates at functioning frequencies of between about 0.4 GHz and about 6 GHz. In one or more embodiments, the high frequency circuit assembly operates at functioning frequencies in centimeter-wave, millimeter-wave and sub-millimeter wave band.

In one or more embodiments, the test socket assembly 100 is used with a device under test (DUT) 200 and can communicate via compliant interconnects with the device under test 200. The test socket assembly 100 allows direct communication between test hardware and the device under test while maintaining a contacted spring probe interface for remaining standard inputs and outputs on a BGA/QFN/WLCSP or any other packaging technology. The test socket assembly 100 can include compliant interconnects and compliant or static lead frames and other features as described in U.S. Pat. No. 10,037,933, which is incorporated herein by reference in its entirety.

In one or more embodiments the test socket assembly 100 includes frame assembly 130, a high speed circuit assembly 210 (FIG. 3-6) such as a lead frame assembly 140, a contactor body 131, compliant interconnects, a printed circuit board 132, probe retainer plate 122, and one or more dowel pins 136, as shown in FIG. 2, which shows an exploded view of the test socket assembly 100 of FIG. 1. There is also substrate material which is used to align and hold the lead frame assembly 140 together.

The test socket assembly 100 is used with a device under test (DUT) 200. A socket opening within the frame assembly 130 receives the DUT 200 therein and assists in aligning the DUT 200 with the test socket assembly 100. The socket opening is sized and configured to receive the DUT 200 therein.

The test socket assembly 100 includes a high-speed lead frame assembly 140 and one or more compliant interconnects, and at least one return. The spring return provides force back up into the assembly 100 and supports the lead frame assembly 140. The lead frame assembly 140 is disposed adjacent to the frame assembly 130, and is electrically coupled with the one or more compliant interconnects, which are also disposed within the frame assembly 130. The lead frame assembly 140 is sandwiched between the frame assembly 130 and the contactor body 131.

In one or more embodiments, as shown in FIGS. 3-6, the high-speed circuit assembly 210 includes a high speed circuit 220 including at least one waveguide/transmission line 222 extending to a waveguide/transmission line end 224. The high-speed circuit assembly 210 can be implemented in the test socket assembly as discussed above, or any other high speed device.

In one or more embodiments, the high-speed circuit 220 has an operating frequency and an operating frequency wavelength. In one or more embodiments, the at least one waveguide/transmission line 222 is defined by a length. In one or more embodiments, the length of the at least one waveguide/transmission line 222 is greater than 0.1*operating frequency wavelength. The relation between frequency and wavelength is:

$$\text{wavelength }(\lambda) = \text{Speed of light }(c)/[\sqrt{\varepsilon} * \text{Frequency }(f)]$$

where $\sqrt{\varepsilon}$ is the dielectric constant of the material used in the waveguide/transmission line structure.

As used herein the term "waveguide/transmission line" includes any structure used for the transmission of electromagnetic energy that restricts transmission to one direction. Transmission lines in which the electromagnetic wave has transverse electric and transverse magnetic (TEM) modes is included in this definition of "waveguide/transmission line." Waveguides in which the electromagnetic wave has transverse electric (TE) and transverse magnetic (TM) modes are included in this definition. Other examples of a "waveguide/transmission line" include but are not limited to rectangular waveguides, strip lines, coaxial cables, microstrips, slotted lines, coplanar waveguides, and rectangular waveguides.

In one or more embodiments, the at least one waveguide/transmission line 222 includes signal attenuation and or extraction of a DC component of the signal via an RF choke. In one or more embodiments, radiation absorbing material is disposed in contact with or in close proximity with the waveguide/transmission line. Close proximity is a measure of distance on the order of microns or tens of microns. In some embodiments, close proximity is between about one micron and 100 microns. In some embodiments, close proximity is between about one micron and about 80 microns. In some embodiments, close proximity is between about one micron and about 60 microns. In some embodiments, close proximity is between about one micron and about 40 microns. In some embodiments, close proximity is between about one micron and about 20 microns. In some embodiments, close proximity is between about one micron and about 10 microns. In some embodiments, close proximity is between about 5 micron and about 10 microns. In some embodiments, the radiation absorbing material is adjacent to the waveguide/transmission line. One structure is adjacent to another when the structures are near each other, next to each other, or touching each other. In one or more embodiments, the radiation absorbing material is in contact with the at least one waveguide/transmission line 222. In one or more embodiments, the radiation absorbing material is used terminate the waveguide/transmission line 222 or to attenuate, and or assist in extracting the DC component of a high frequency signal propagated along the waveguide/transmission line 222.

In one or more embodiments, the radiation absorbing material absorbs signals having functioning frequencies in centimeter-wave, millimeter-wave and sub-millimeter wave bands. In one or more embodiments, the radiation absorbing material absorbs signals having functioning frequencies of between about 37 GHz and about 81 GHz. In one or more embodiments, the radiation absorbing material absorbs signals having functioning frequencies of between about 20 GHz and about 40 GHz. In one or more embodiments, the radiation absorbing material absorbs signals having functioning frequencies of between about 0.4 GHz and about 6 GHz.

Figure 5:
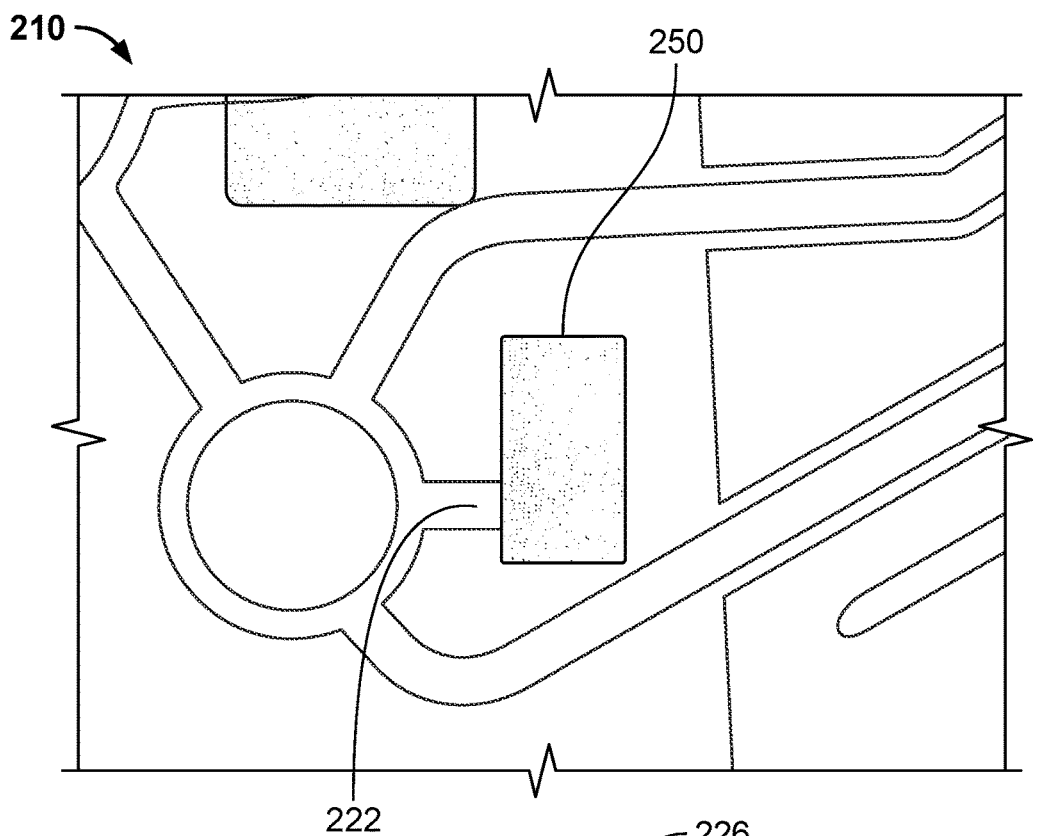
FIG. 5 illustrates a top view of a high frequency circuit assembly as constructed in one or more embodiments.

In one or more embodiments the high-speed circuit assembly 210 further includes a frame assembly 230 disposed near the lead frame 240, and the frame assembly 230 is a ground reference or a ground plane 260 for the lead frame 240. In one or more embodiments the high-speed circuit assembly 210 further includes a frame assembly 230 disposed near the lead frame 240, and the frame assembly 230 is a power supply. In one or more embodiments, the radiation absorbing material 250 is disposed between the frame assembly 230 and the waveguide/transmission line end 224. In one or more embodiments, the frame assembly 230 includes a recess 232, and the radiation absorbing material 250 is disposed at least partially within the recess 232. In one or more embodiments, the radiation absorbing material 250 is an attenuator for the high-speed circuit 220. For example, the radiation absorbing material 250 can be disposed on top of the waveguide/transmission line 222, as shown in FIG. 5.

Figure 3:
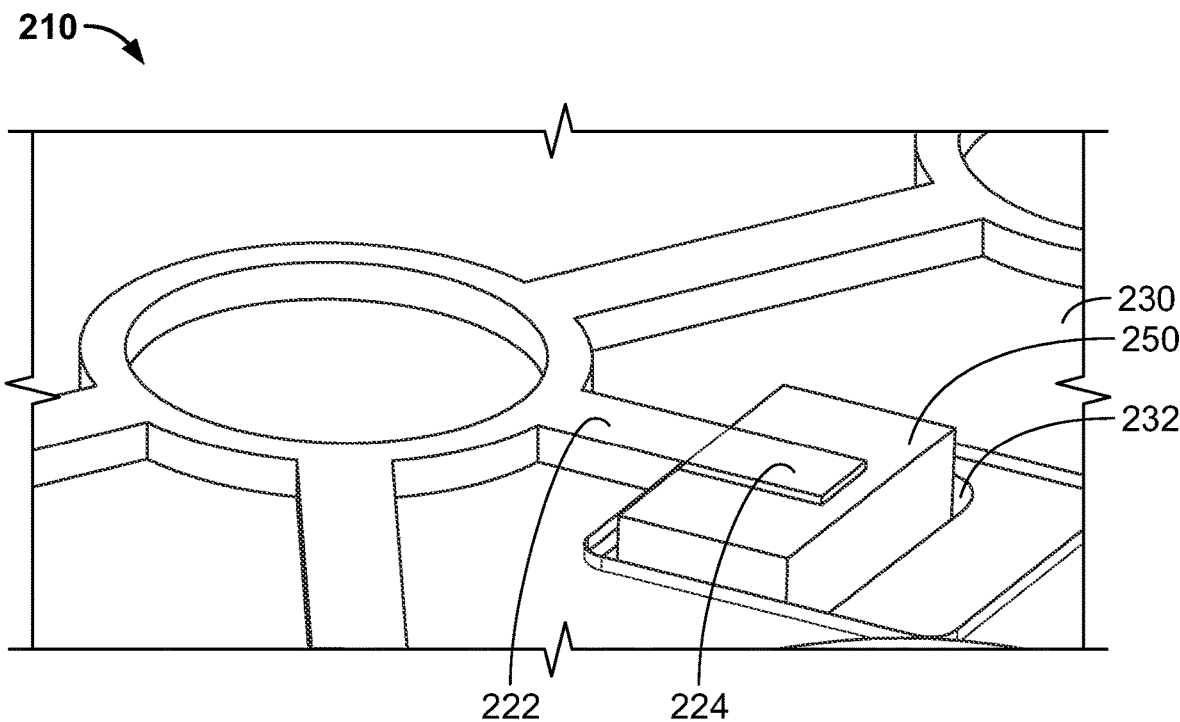
FIG. 3 illustrates a perspective view of a portion of a high frequency circuit assembly as constructed in one or more embodiments.
Figure 4:
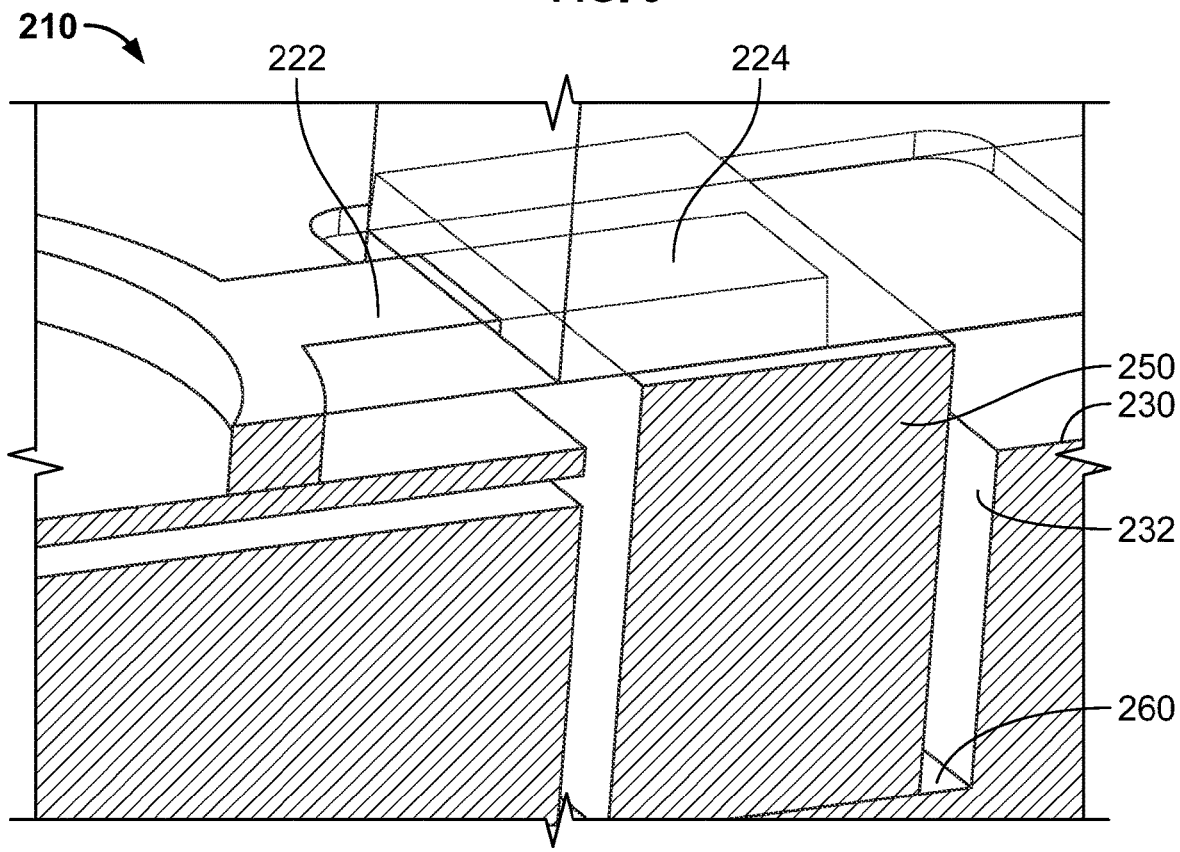
FIG. 4 illustrates a perspective view of a portion of a high frequency circuit assembly as constructed in one or more embodiments.
Figure 6:
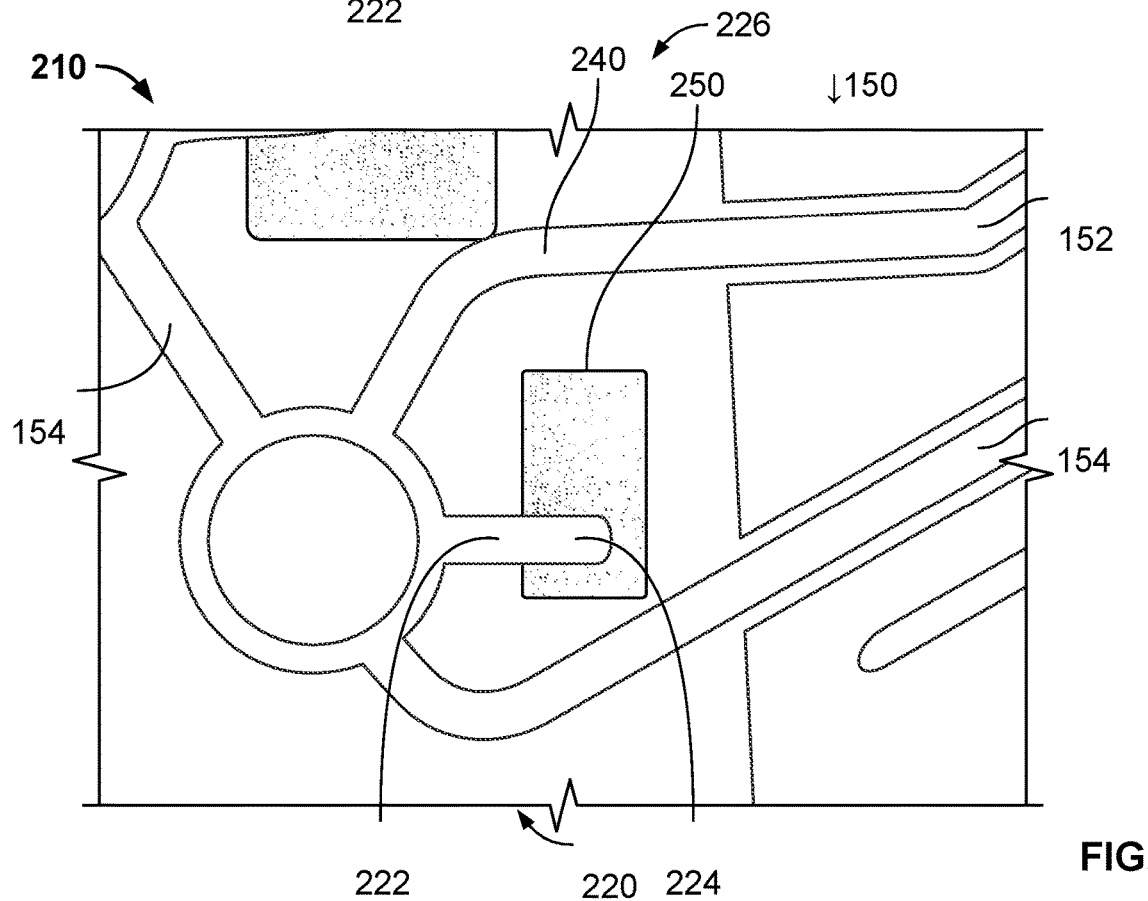
FIG. 6 illustrates a top view of a high frequency circuit assembly as constructed in one or more embodiments.

In one or more embodiments, the high-speed circuit 220 is a lead frame 240 with a ring coupler 226, as shown in FIG. 3, FIG. 4, and FIG. 6, which show the lead frame 240 in greater detail. The lead frame 240 can also include a hybrid ring coupler including at least one ring, at least one input 152, at least two outputs 154, where the hybrid ring coupler 150 forms part of the lead frame 240. In one or more embodiments, at least one of the at least two outputs include a device contact portion to contact the DUT 200 when the DUT is disposed within the socket opening. The hybrid ring coupler 150 further includes a terminator, such as isolation port with an absorber. In one or more embodiments, the lead frame assembly 240 includes a loop back trace electrically coupled between the at least one input and the at least two outputs.

A method includes applying a high frequency signal to a high-speed circuit assembly, where the high-speed circuit includes at least one waveguide/transmission line extending to a waveguide/transmission line end, and radiation absorbing material in contact with or in close proximity with the at least one waveguide/transmission line. In some embodiments, the radiation absorbing material is adjacent to the at least one waveguide/transmission line. The method further includes attenuation or assistance in DC component extraction of the high frequency signal with the radiation absorbing material.

Figure 7:
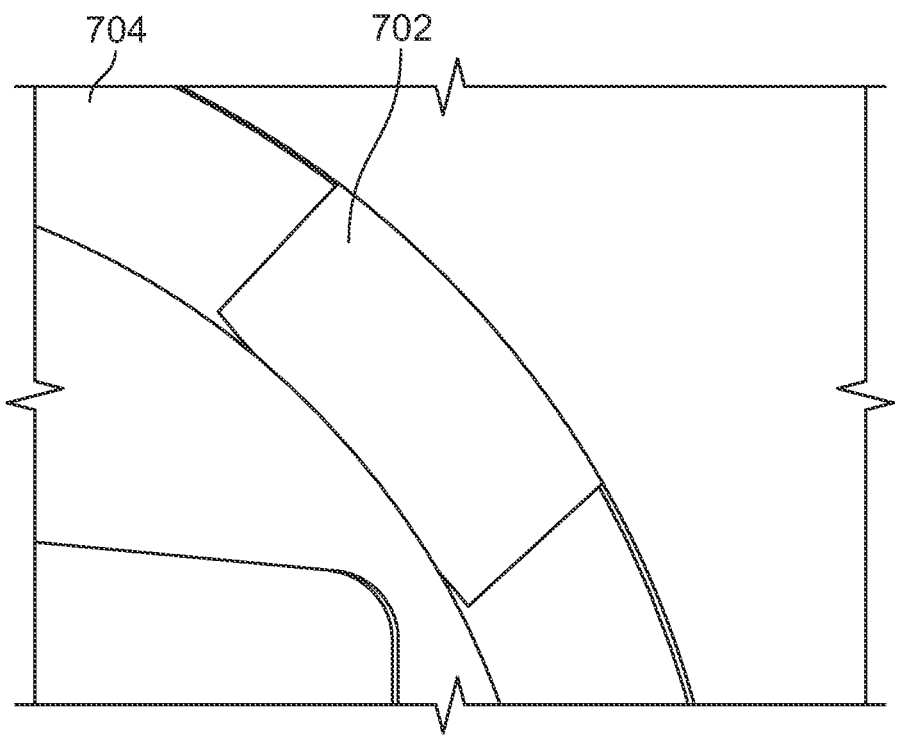
FIG. 7 illustrates a top view of radiation absorbing material in contact with a waveguide/transmission line as constructed in one or more embodiments.

FIG. 7 illustrates a top view of radiation absorbing material 702 in contact with or in close proximity with a waveguide/transmission line 704 as constructed in one or more embodiments.

Figure 8:
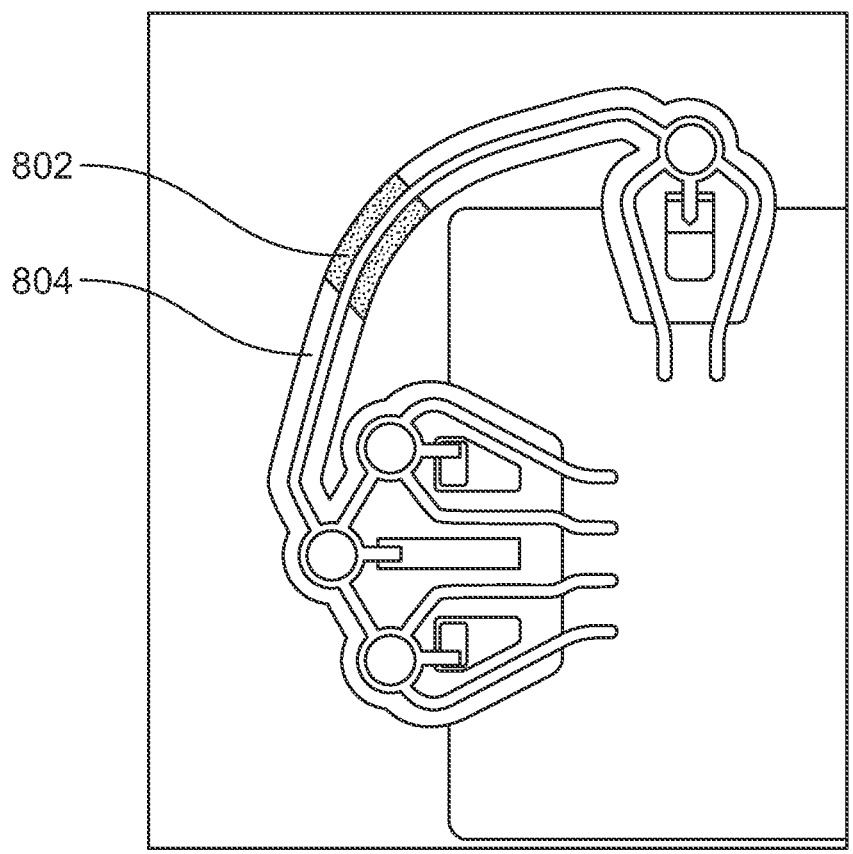
FIG. 8 illustrates a schematic view of radiation absorbing material in contact with a waveguide/transmission line as constructed in one or more embodiments.

FIG. 8 illustrates a schematic view of radiation absorbing material 802 in contact with or in close proximity with a waveguide/transmission line 804 as constructed in one or more embodiments.

Figure 9:
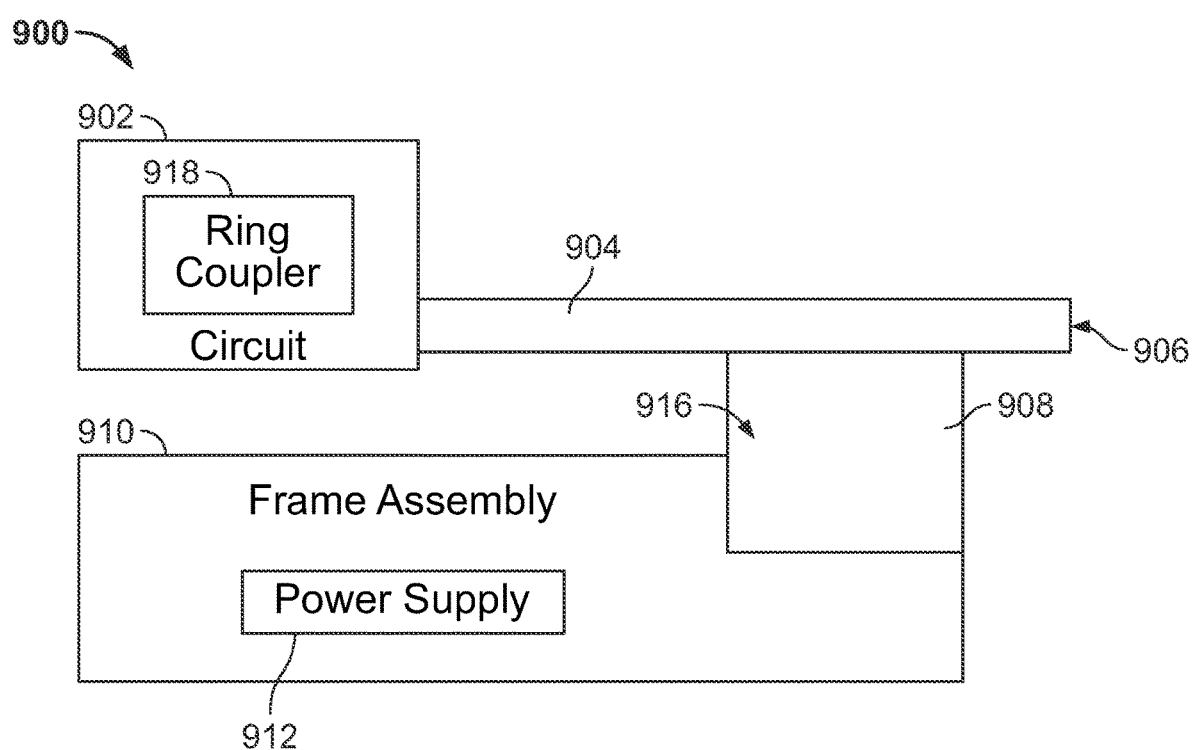
FIG. 9 illustrates a block diagram of a circuit assembly in accordance with one or more embodiments.

FIG. 9 illustrates a block diagram of a circuit assembly 900 in accordance with one or more embodiments of the present disclosure. The circuit assembly 900 includes a circuit 902 including a waveguide/transmission line 904 including a waveguide/transmission line end 906. In operation, the waveguide/transmission line 904 carries a radio frequency signal. A radiation absorbing material 908 is in contact with and adjacent to the waveguide/transmission line 904. Exemplary radiation absorbing materials include carbon, graphite, carbonyl iron, metals and ferrites, and artificial dielectrics. In operation, the radiation absorbing material 908 may modify the radio frequency signal. In some embodiments, the circuit 902 is a lead frame. In some embodiments, the circuit assembly 900 further includes a frame assembly 910 disposed near the lead frame. In some embodiments, the circuit 902 is a printed circuit board (PCB) trace or includes a PCB trace. In operation, the frame assembly 910 provides a ground reference for the lead frame. In some embodiments, the circuit assembly 900 further includes the frame assembly 910 disposed near the lead frame. In some embodiments, the frame assembly 910 includes a power supply 912. In some embodiments, the radiation absorbing material 908 is disposed in contact with or in close proximity with the frame assembly 910. In some embodiments, the radiation absorbing material 908 is adjacent to the frame assembly 910. In some embodiments, the frame assembly 900 includes a recess 916, and the radiation absorbing material 908 is disposed at least partially within the recess. In some embodiments, the circuit 902 includes at least one ring coupler 918.

In some embodiments, a method includes applying a signal to a circuit assembly including a circuit including a waveguide/transmission line and radiation absorbing material, the radiation absorbing material in contact with and adjacent to the waveguide/transmission line, the waveguide/transmission line extending to a waveguide/transmission line end, and attenuating or radio frequency choking the high frequency signal with the radiation absorbing material.

A test socket assembly includes a frame assembly, a high-speed circuit, and a radiation absorbing material. In some embodiments, the frame assembly has a socket opening sized and configured to receive a device under test therein. The high-speed circuit includes a waveguide/transmission line extending to a waveguide/transmission line end. The high-speed circuit includes a lead frame assembly disposed adjacent to the frame assembly. In operation, the waveguide/transmission line to carry a radio frequency signal including a high frequency signal and a substantially direct current signal. In some embodiments the radiation absorbing material is in contact with and in close proximity with the waveguide/transmission line. In some embodiments, the radiation absorbing material is adjacent to the waveguide/transmission line. In operation, the radiation absorbing material to attenuate or block the high frequency signal and allow the substantially direct current signal to pass in the waveguide/transmission line.

The high-speed circuit assembly includes an effective and inexpensive solution to conventional attenuators, or RF choke components along waveguide/transmission lines that would be otherwise prohibitively expensive or difficult to apply in fixed amounts of attenuation as with conventional attenuators, particularly at high frequencies. The test socket assembly described and shown herein is a test socket that is compatible with semiconductor back-end manufacturing, yet is capable in operating at the R-band to W-band frequency ranges and includes a high speed circuit with radiation absorbing material as an attenuator to assist in DC component extraction off of a waveguide/transmission line end. Optionally, the test socket assembly includes a hybrid ring coupler embedded within the contactor as a splitter, and including the radiation absorbing material attenuator or RF choke. The hybrid ring coupler allows for the large bandwidth and high isolation when splitting a signal from one line to two lines and can be used for splitting high frequency signals.

Figure 10:
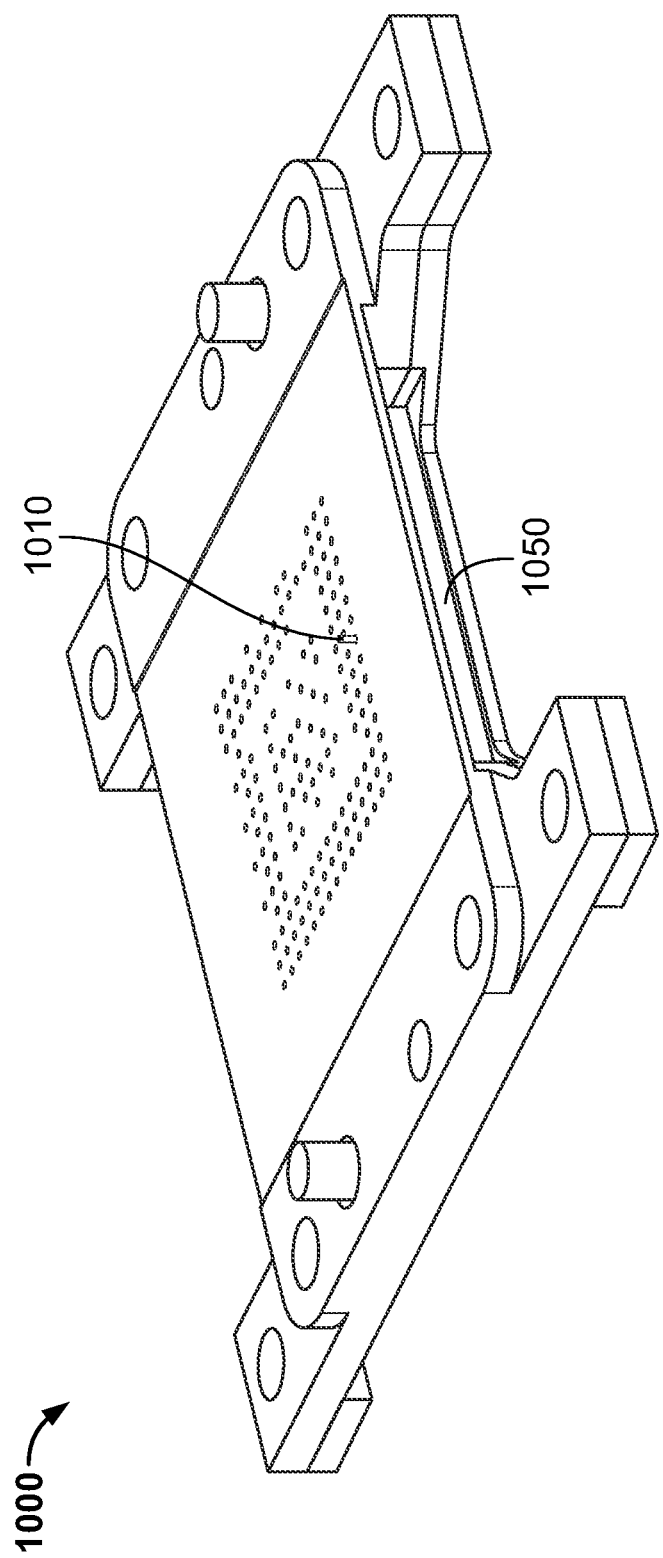
FIG. 10 illustrates a contactor assembly including a contact signal probe and a radiation absorbing structure as constructed in one or more embodiments.

FIG. 10 illustrates a contactor assembly 1000 including a contactor signal probe 1010 and the radiation absorbing structure 1050 as constructed in one or more embodiments. The contactor signal probe 1010 is a waveguide/transmission line suitable for use in contacting pins or ports in a device under test such as an integrated circuit. In some embodiments, the radiation absorbing structure 1050 is formed from the radiation absorbing material described above. In some embodiments, the radiation absorbing structure 1050 is a structure, such as a rectangular block, having holes through which the contactor signal probe 1010 passes. In some embodiments, the contactor signal probe 1010 is in contact with the radiation absorbing structure 1050. In some embodiments, the contactor signal probe 1010 is in contact with the radiation absorbing structure 1050, and the waveguide/transmission line 222 (shown in FIG. 3-6) is in contact with the radiation absorbing material 250. In some embodiments, the contactor signal probe 1010 is in close proximity with the radiation absorbing structure 1050 and does not contact the radiation absorbing structure 1050. In some embodiments, the contactor signal probe 1010 is in close proximity with the radiation absorbing structure 1050, and the waveguide/transmission line 222 is in close proximity with the radiation absorbing material 250. A radiation absorbing material suitable use in connection with the fabrication of the radiation absorbing structure 1050 includes a rigid magnetized epoxy loaded stock. In operation, the contactor signal probe 1010 is a waveguide/transmission line and couples a signal from a device under test, such as an integrated circuit, to the radiation absorbing structure 1050. The radiation absorbing structure 1050 terminates the contactor signal probe 1010 for a signal originating at the device under test.

Figure 11:
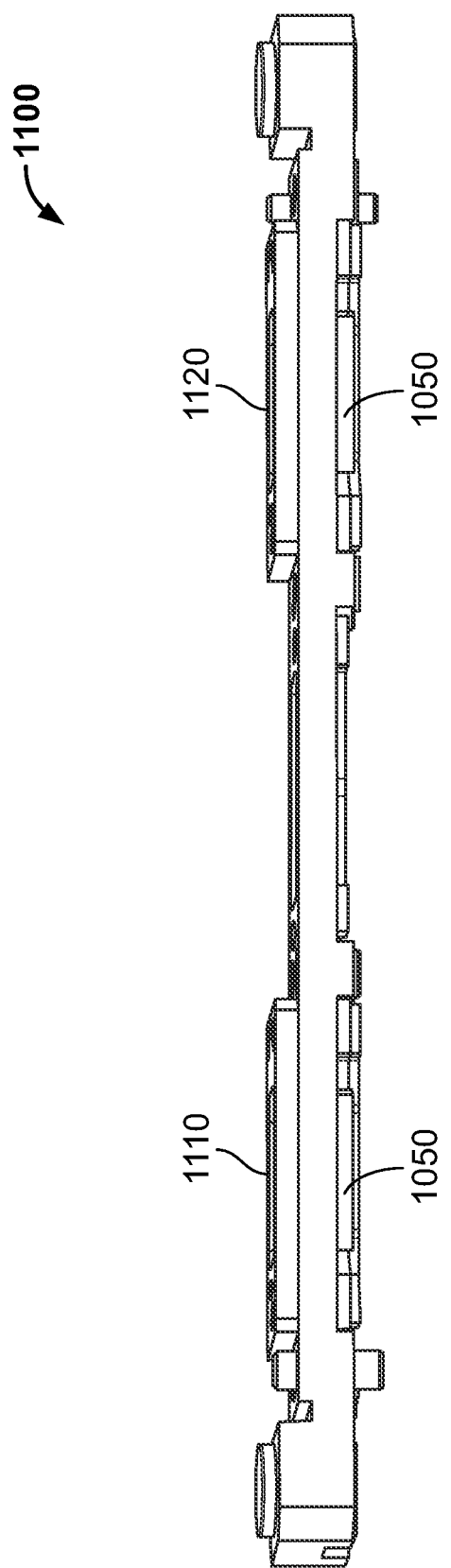
FIG. 11 illustrates a contactor assembly having two test sites including a first test site and a second test site and the radiation absorbing structure as constructed in one or more embodiments.

FIG. 11 illustrates a contactor assembly 1100 having two test sites including a first test site 1110 and a second test site 1120 and the radiation absorbing structure 1050 as constructed in one or more embodiments.

Figure 12:
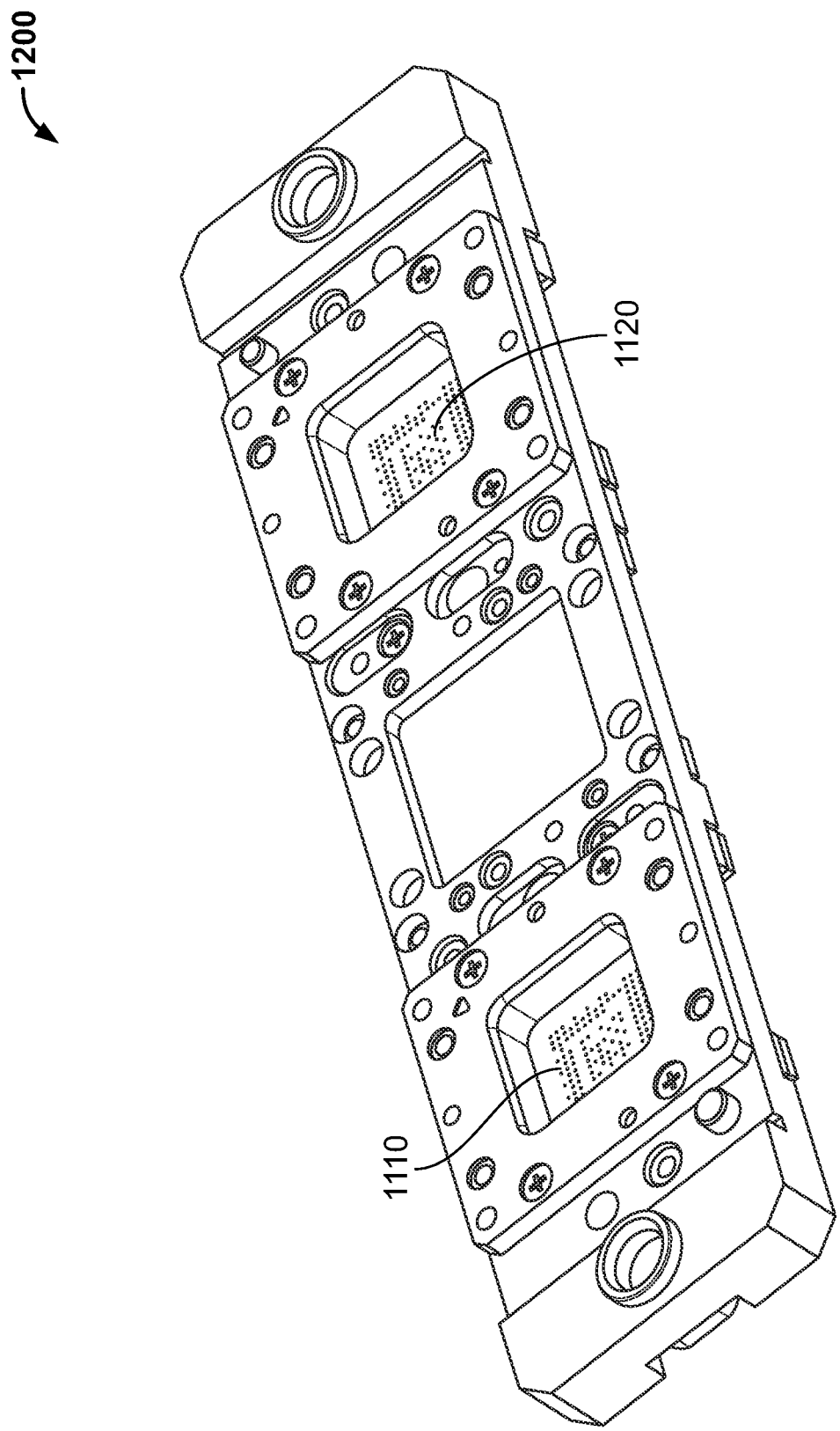
FIG. 12 illustrates the contactor assembly having two sites including the first test site and the second test site as constructed in one or more embodiments.

FIG. 12 illustrates the contactor assembly 1100 having two sites including the first test site 1110 and the second test site 1120 as constructed in one or more embodiments.

Figure 13:
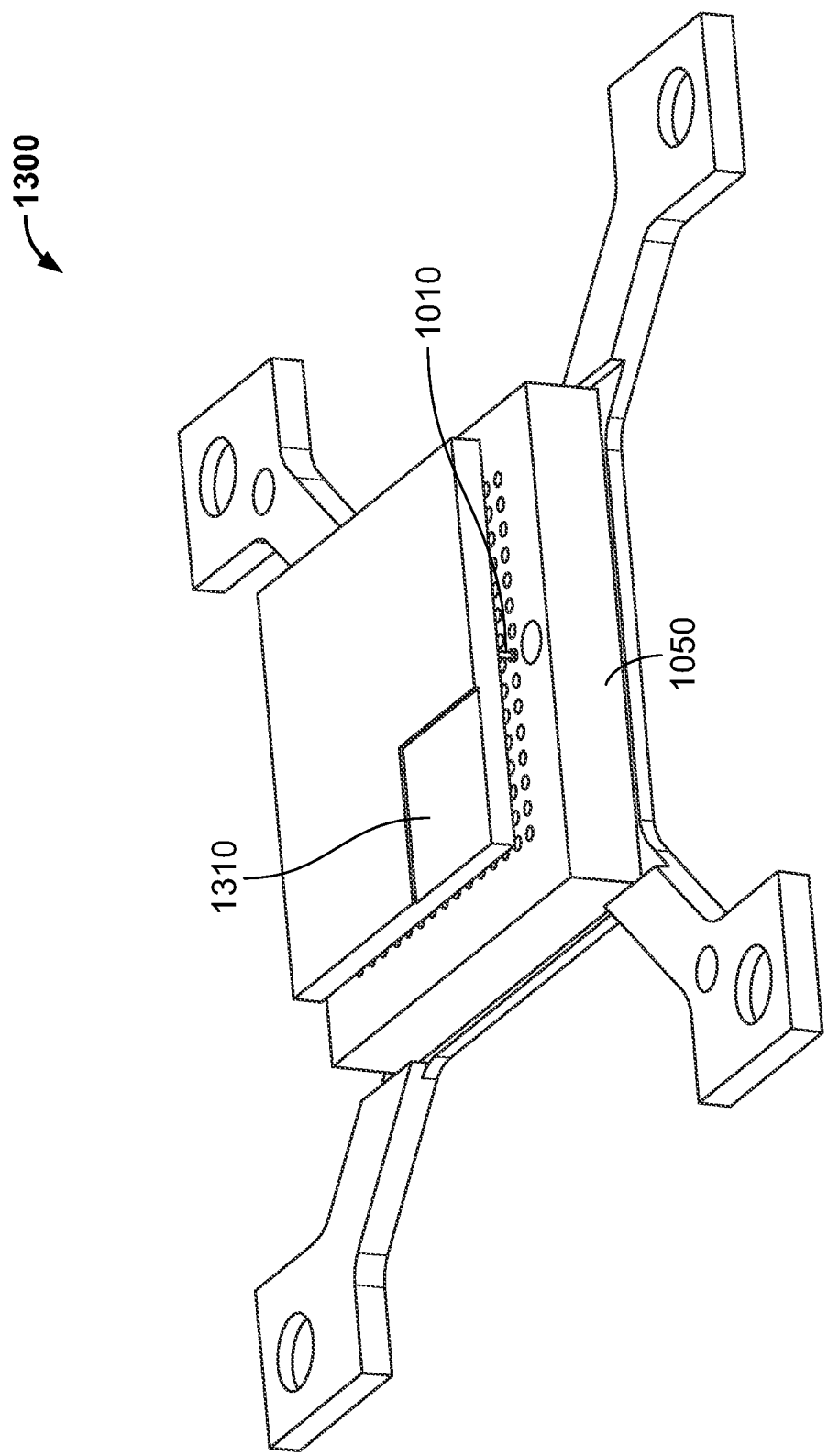
FIG. 13 illustrates a contactor assembly including a die and the radiation absorbing structure and the contactor signal probe as constructed in one or more embodiments.

FIG. 13 illustrates a contactor assembly 1300 including a die 1310 and the radiation absorbing structure 1050 and the contactor signal probe 1010 as constructed in one or more embodiments. The die 1310 includes an integrated circuit. In some embodiments, the contactor signal probe 1010 is in contact with the radiation absorbing structure 1050. In some embodiments, the contactor signal probe 1010 is in close proximity with the radiation absorbing structure 1050 and is not in contact with the radiation absorbing structure 1050. In operation, the contactor signal probe 1010 couples a test signal to the die 1310 and the integrated circuit included on the die 1310.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope should, therefore, be determined with reference to the appended claims, along with the full scope of equivalents to which such claims are entitled.

What is claimed is:

1. A test socket assembly comprising:
   a frame assembly having a socket opening sized and configured to receive a device under test therein;
   a high-speed circuit including a waveguide/transmission line extending to a waveguide/transmission line end, the high-speed circuit including a lead frame assembly disposed adjacent to the frame assembly, the waveguide/transmission line to carry a radio frequency signal including a high frequency signal and a substantially direct current signal; and
   a radiation absorbing material in contact with or in close proximity with the waveguide/transmission line, the radiation absorbing material to attenuate or block the high frequency signal and allow the substantially direct current signal to pass in the waveguide/transmission line.

2. The test circuit assembly as recited in claim 1, wherein the high-speed circuit includes at least one ring coupler.

3. The test circuit assembly as recited in claim 1, wherein the radiation absorbing material absorbs signals having frequencies in centimeter-wave, millimeter-wave and sub-millimeter wave band.

* * * * *

UNITED STATES PATENT AND TRADEMARK OFFICE
CERTIFICATE OF CORRECTION

| | | |
|---|---|---|
| PATENT NO. | : 11,650,227 B2 | Page 1 of 1 |
| APPLICATION NO. | : 17/142987 | |
| DATED | : May 16, 2023 | |
| INVENTOR(S) | : Yukang Feng et al. | |

It is certified that error appears in the above-identified patent and that said Letters Patent is hereby corrected as shown below:

In the Claims

Column 8, Line 45, Claim 2, please delete "test circuit" and insert -- test socket --; and Column 8, Lines 47, Claim 3, please delete "test circuit" and insert -- test socket -- therefor.

Signed and Sealed this
Eleventh Day of June, 2024

Katherine Kelly Vidal
*Director of the United States Patent and Trademark Office*